United States Patent
Lai et al.

(10) Patent No.: US 11,291,132 B2
(45) Date of Patent: Mar. 29, 2022

(54) HOUSING AND ELECTRONIC DEVICE USING SAME

(71) Applicant: PEGATRON CORPORATION, Taipei (TW)

(72) Inventors: Ju-Ting Lai, Taipei (TW); Chung-Hsien Huang, Taipei (TW); Hsing-Hao Chen, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 17/178,330

(22) Filed: Feb. 18, 2021

(65) Prior Publication Data

US 2021/0329805 A1    Oct. 21, 2021

(30) Foreign Application Priority Data

Apr. 16, 2020 (TW) .................. 109112874

(51) Int. Cl.
*H05K 5/06* (2006.01)
*H05K 5/02* (2006.01)
*H05K 7/14* (2006.01)

(52) U.S. Cl.
CPC ........... *H05K 5/069* (2013.01); *H05K 5/0265* (2013.01); *H05K 5/064* (2013.01); *H05K 7/1402* (2013.01)

(58) Field of Classification Search
CPC ............................. H05K 7/1402; H05K 5/265
See application file for complete search history.

(56) References Cited

U.S. PATENT DOCUMENTS

| 5,563,770 | A | * | 10/1996 | Bethurum | ............ | G06K 19/077 |
|---|---|---|---|---|---|---|
| | | | | | | 257/679 |
| 7,048,564 | B1 | | 5/2006 | Hinze | | |
| 2002/0039284 | A1 | * | 4/2002 | Hsu | ...................... | H05K 5/0269 |
| | | | | | | 361/737 |
| 2016/0197420 | A1 | * | 7/2016 | Zhu | ...................... | H02J 7/0044 |
| | | | | | | 439/78 |

FOREIGN PATENT DOCUMENTS

| CN | 110499917 A | 11/2019 |
|---|---|---|
| CN | 110602865 A | 12/2019 |
| EP | 1737286 A2 | 12/2006 |
| TW | M506395 U | 8/2015 |

OTHER PUBLICATIONS

European Search Report on European Patent Application No. EP 21 16 2236 dated Jul. 27, 2021.

* cited by examiner

*Primary Examiner* — Hung V Ngo
(74) *Attorney, Agent, or Firm* — McClure, Qualey & Rodack, LLP

(57) ABSTRACT

A housing includes a base and a mark piece. The base includes a bottom wall and at least one side wall. The at least one side wall is vertically connected to the bottom wall. A height of the side wall exists between a top end of the at least one side wall and the bottom wall. The mark piece is disposed on the bottom wall and extends from the bottom wall in a direction away from the bottom wall. The mark piece has a low scale and a high scale. A distance from the low scale to the bottom wall is less than the height of the side wall. A distance from the high scale to the bottom wall is substantially the same as the height of the side wall.

13 Claims, 5 Drawing Sheets

HOUSING AND ELECTRONIC DEVICE USING SAME

CROSS-REFERENCE TO RELATED APPLICATION

This non-provisional application claims priority under 35 U.S.C. § 119(a) to Patent Application No. 109112874 filed in Taiwan, R.O.C. on Apr. 16, 2020, the entire contents of which are hereby incorporated by reference.

BACKGROUND

Technical Field

The application relates to a housing and an electronic device using the same, and in particular, to a housing with a mark and an electronic device using the same.

Related Art

An electronic device that is exposed to outdoor environments for a long time, such as a server and a power supply for an electric bicycle, or an electronic component used in a telecommunication base station needs to be particularly provided with a protective structure to prevent invasion of moisture and dust, to ensure performance stability of the electronic device and extend service life of the electronic device.

A common protection method is to fill an inside of a housing with a colloid, and encase an electronic component with the colloid, to block moisture and dust. However, in the existing method of filling the colloid, a weight of the colloid in the housing needs to be repeatedly measured to confirm whether a sufficient amount of colloids is filled, and a status of the colloid filling needs to be checked from all angles of the housing. It can be seen from the above that the existing colloid filling method is inefficient in a manufacturing process, and it often occurs that the electronic component is not encased by the colloid or the colloid is overfilled to cause colloid overflow.

SUMMARY

In view of the above problem, the disclosure provides a housing including a base and a mark piece. The base includes a bottom wall and at least one side wall. The at least one side wall is vertically connected to the bottom wall. A height of the side wall exists between a top end of the at least one side wall and the bottom wall. The mark piece is disposed on the bottom wall and extends from the bottom wall in a direction away from the bottom wall. The mark piece has a low scale and a high scale. A distance from the low scale to the bottom wall is less than the height of the side wall. A distance from the high scale to the bottom wall is substantially the same as the height of the side wall. In this way, a colloid can be filled according to the mark piece having the low scale and the high scale to implement the multi-stage filling of the colloid. No weighing procedure is required and an appropriate amount of the required colloid can be filled. So that the electronic component in the housing can be completely encased by the colloid, and a problem of colloid overflow can be alleviated.

In some embodiments, the base further includes a mounting side. The mounting side is provided with a retaining wall that is disposed on the bottom wall and that extends from the bottom wall in a direction away from the bottom wall. A distance from the retaining wall to the bottom wall is greater than the distance from the low scale to the bottom wall. In this way, when the filled colloid reaches the low scale, the colloid is blocked by the retaining wall and does not flow out from the mounting side.

In some embodiments, the mark piece is provided with a step structure. The step structure includes a first step and a second step structure. A top surface of the first step is the low scale, and a top surface of the second step is the high scale.

In some embodiments, the mark piece is in a cylindrical shape.

In some embodiments, the mark piece is in a flat shape.

In some embodiments, the mark piece further includes a middle scale located between the high scale and the low scale of the mark piece.

In addition, the disclosure provides an electronic device in another embodiment. The electronic device includes the housing described above and a circuit board. The circuit board is accommodated in the base. The circuit board includes a board body, a through hole, and a plurality of electronic components. The board body is provided with a first surface and a second surface disposed opposite to each other, where the first surface faces the bottom wall. The through hole penetrates the first surface and the second surface of the board body. The plurality of electronic components are disposed on the first surface. The distance from the low scale to the bottom wall is greater than a longest distance from tops of the electronic components to the bottom wall. In this way. The colloid can be supplemented through the through hole to ensure that the plurality of electronic components are filled with the colloid, and the manner of supplementing the colloid can prevent the colloid from generating bubbles.

In some embodiments, the through hole is located in a center of the board body. In this way, the colloid injected through the through hole can diffuse outward from the center, avoiding a case that the colloid cannot flow to corners due to viscosity.

In some embodiments, a shape of the through hole is roughly equivalent to or slightly larger than an outer shape of the mark piece, to facilitate filling of the colloid through the through hole.

Detailed features and advantages of the application are described in detail in the following embodiments, and the content of the embodiments is sufficient for a person skilled in the art to understand and implement the technical content of the invention. A person skilled in the art can easily understand the objectives and advantages related to the invention according to the contents disclosed in this specification, the claims and the drawings.

BRIEF DESCRIPTION OF THE DRAWINGS

The disclosure will become more fully understood from the detailed description given herein below for illustration only, and thus not limitative of the disclosure, wherein.

DETAIL DESCRIPTION OF THE EMBODIMENTS

Figure 1:
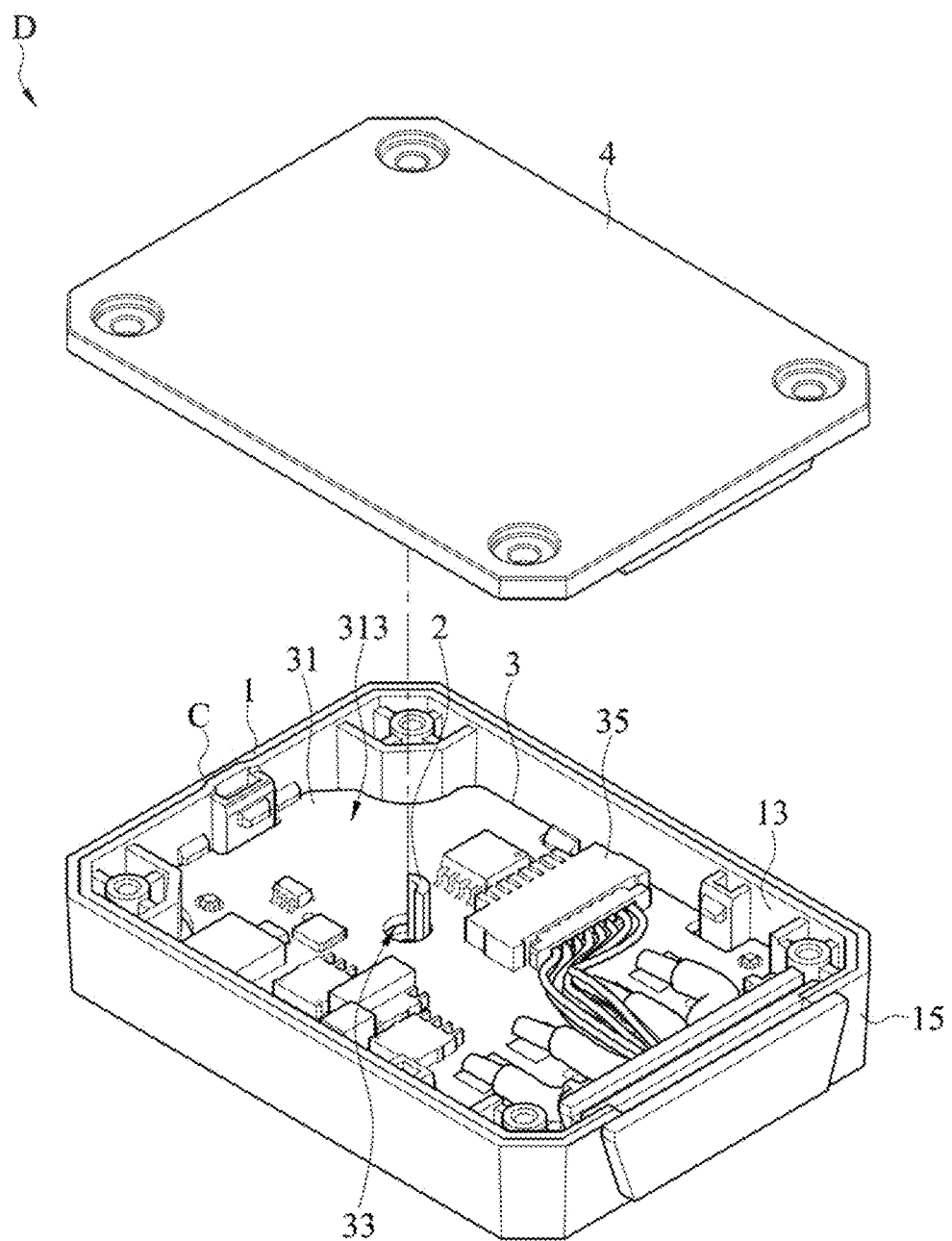
FIG. 1 illustrates a perspective exploded view of an electronic device according to a first embodiment.
Figure 6:
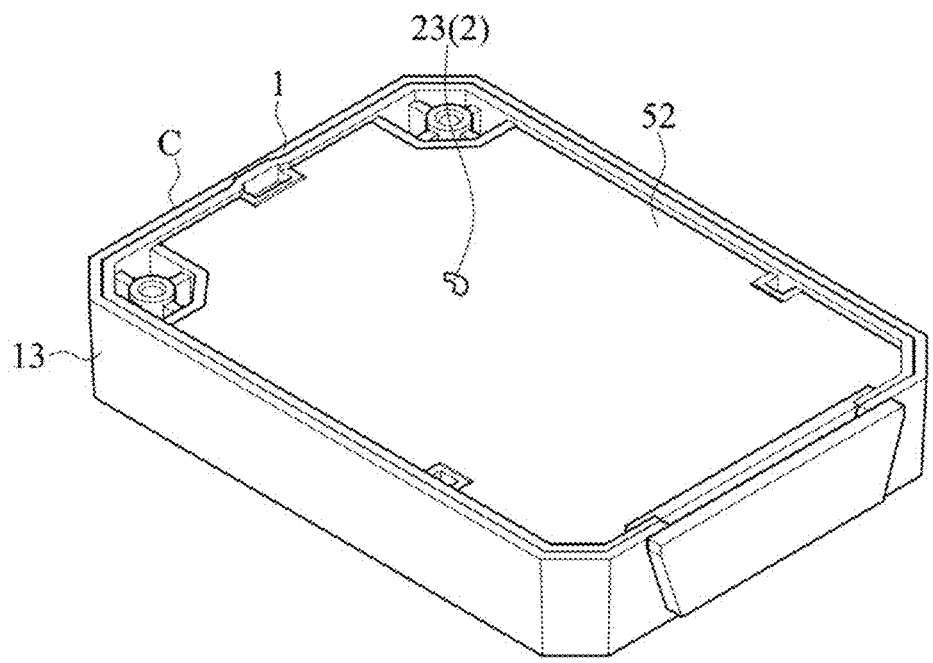
FIG. 6 illustrates a schematic view of an electronic device omitting a cover according to the first embodiment.

Referring to FIG. 1, FIG. 1 is a perspective exploded view of an electronic device according to an embodiment of the disclosure. Please refer to FIG. 1 for this embodiment. An electronic device D includes a housing C, a circuit board 3, and a cover 4. The housing C includes a base 1 and a mark piece 2. The circuit board 3 and the mark piece 2 are located in the base 1. According to scales marked on the mark piece 2, colloids 51 and 52 (shown in FIG. 3 and FIG. 6) can be filled in the base 1 in a multi-stage manner. The colloids 51 and 52 encase the circuit board 3 to achieve waterproof and moisture-proof effects. Then, the cover 4 is covered to complete assembly of the electronic device D of the application. Herein, the filled colloids 51 and 52 may be materials with waterproof and moisture-proof effects such as epoxy and polyurethane (PU). However, the disclosure is not limited thereto. Herein, FIG. 1 is taken as a schematic diagram after parts of the filled colloids 51 and 52 are removed. An internal state of the housing C with the cover 4 actually removed is shown in FIG. 6.

Exemplary structures of the housing C and the circuit board 3 and a connection method thereof are further described below.

First Embodiment

Figure 2A:
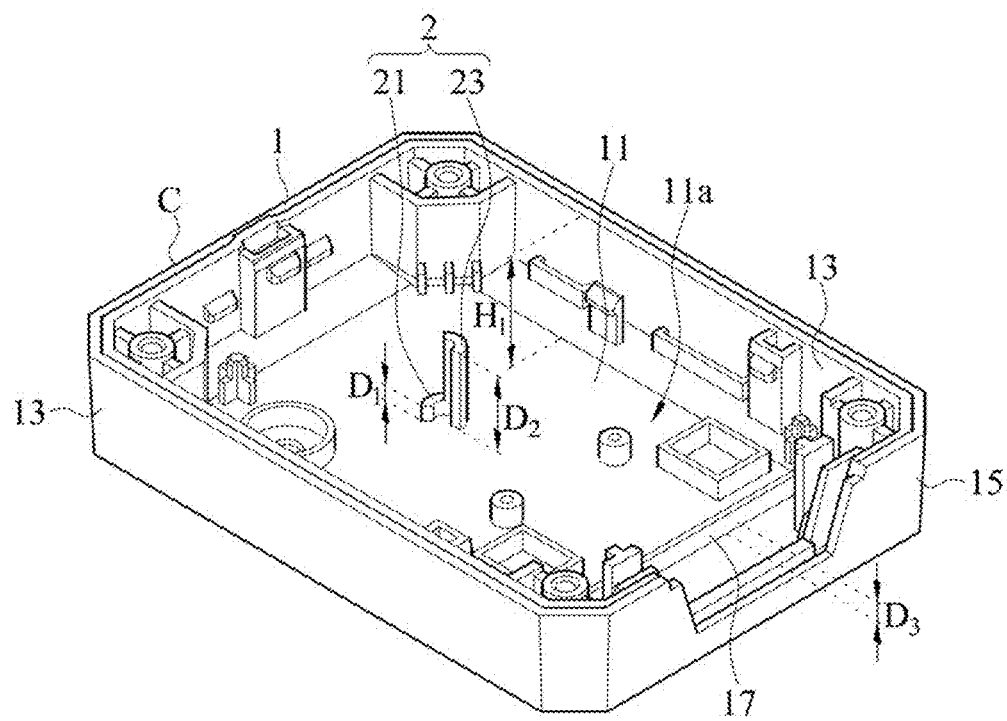
FIG. 2A illustrates a schematic perspective view of a housing according to the first embodiment.
Figure 2B:
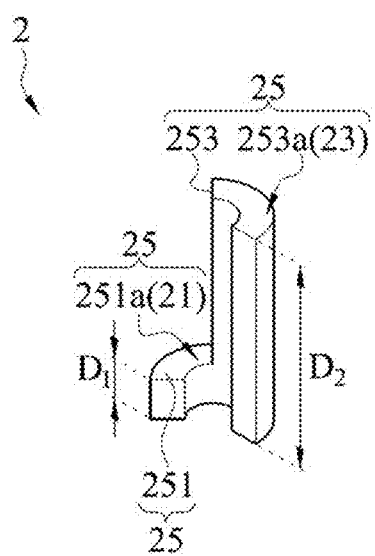
FIG. 2B illustrates a schematic perspective view of a mark piece according to the first embodiment.

Referring to FIG. 1, FIG. 2A, and FIG. 2B, FIG. 2A is a schematic perspective view of a housing according to the first embodiment of the disclosure, and FIG. 2B is a schematic perspective view of a mark piece according to the first embodiment of the disclosure. Please refer to FIG. 2A for this embodiment. The base 1 includes a bottom wall 11, three side walls 13, and a mounting side 15. The side walls 13 are vertically disposed on the bottom wall 11. In detail, the three side walls 13 may be connected to each other and connected around the bottom wall 11. In addition, a height of the side wall H1 exists between a top end of the three side walls 13 and the bottom wall 11. However, the disclosure is not limited thereto. According to actual requirements, one or more unequal side walls 13 may be connected to each other, and are surrounded into a rectangle or polygon when viewed from above. There may be one or more mounting sides 15 as well, and a design thereof may be changed according to an electronic component 35 to be mounted.

The mark piece 2 is disposed on the bottom wall 11 and extends from the bottom wall 11 in a direction away from the bottom wall 11. Herein, the mark piece 2 may be integrally formed on the bottom wall 11 in a manner of compression molding or injection molding, or the mark piece 2 may be an independent component, which is fixed to the bottom wall 11 in a manner of gluing, magnetic attraction, locking, or crewing.

Referring to FIG. 2A and FIG. 2B, the mark piece 2 has a low scale 21 and a high scale 23. As shown in FIG. 2B, the low scale 21 is disposed on a top of a left-half cylinder of the mark piece 2, and the high scale 23 is disposed on a top of a right-half cylinder of the mark piece 2. A distance D1 from the low scale 21 to an upper surface 11a of the bottom wall 11 is less than the height of the side wall H1, which is a distance D3 from a top end of the side wall 13 to the upper surface 11a of the bottom wall 11. A distance D2 from the high scale 23 to the upper surface 11a of the bottom wall 11 may be substantially the same as the height of the side wall H1, which is the distance D3 from the top end of the side wall 13 to the upper surface 11a of the bottom wall 11. Herein, "substantially the same" means that the distance D2 from the high scale 23 to the upper surface 11a of the bottom wall 11 may be slightly higher or lower than the height of the side wall H1 due to a manufacturing tolerance.

Based on the above, the low scale 21 is lower than the high scale 23. Herein, the low scale 21 and the high scale 23 respectively marks amounts of colloids to be filled in different stages. In other words, the colloids 51 and 52 are filled into the base 1 in stages. First, the colloid 51 is filled until the colloid 51 reaches the low scale 21. Then the colloid 52 is filled until the colloid 52 reaches the high scale 23. When the colloid 52 reaches the high scale 23, it indicates that the base 1 has been roughly filled with the colloids 51 and 52. Please refer to FIG. 3 and FIG. 6 for different stages in which the colloids 51 and 52 are filled in the base 1.

In the following, a specific structure of the mark piece 2 is explained, and a procedure of filling the colloids 51 and 52 in stages is explained in due course.

Figure 2C:
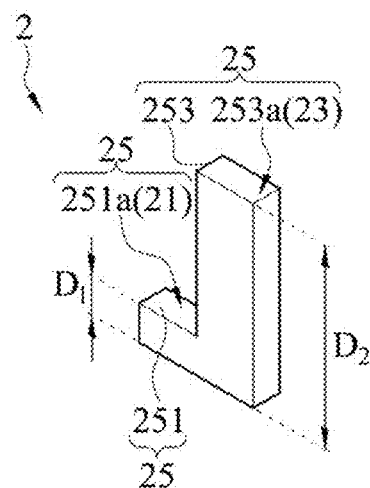
FIG. 2C illustrates a schematic perspective view of a mark piece according to another implementation.

Referring to FIG. 2B and FIG. 2C, FIG. 2C is a schematic perspective view of a mark piece according to another embodiment of the disclosure. In this embodiment, the mark piece 2 is provided with a step structure 25. Herein, the mark piece 2 may be surrounded by aboard body to form a semi-cylindrical structure (as shown in FIG. 2B), or may be formed by only a flat board body (as shown in FIG. 2C). A step-shaped structure may be cut on the board body in a manner such as stamping, milling, and grinding. However, production of the step structure 25 of the mark piece 2 in the above manufacturing process is not limited in the disclosure. In addition, the shape of the mark piece 2, which may be hollow and semi-cylindrical (as shown in FIG. 2B) or flat (as shown in FIG. 2C), is not limited in the disclosure. The mark piece 2 may be designed into different shapes according to actual requirements.

Further, the step structure 25 includes a first step 251 and a second step 253. A top surface 251a of the first step 251 is defined as the low scale 21, and a top surface 253a of the second step 253 is defined as the high scale 23.

Herein, the top surfaces 251a and 253a may be further painted by spraying and pasted with stickers, which makes it easier for production line worker to identify the low scale 21 (251a) and the high scale 23 (253a). It facilitate filling work of the colloids 51 and 52.

Figure 3:
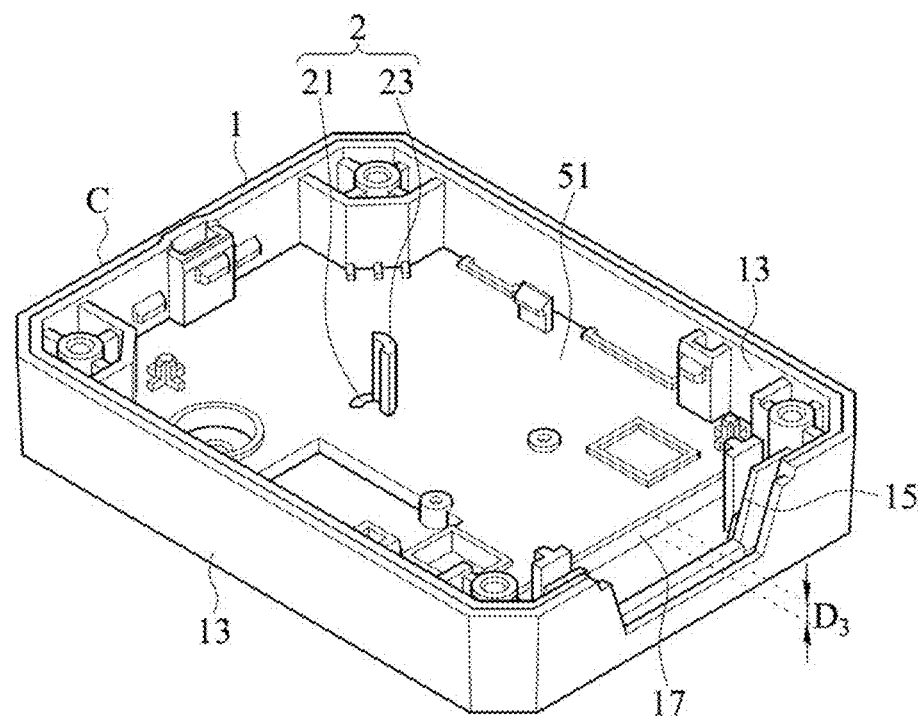
FIG. 3 illustrates a schematic view of a housing partially filled with a colloid according to the first embodiment.
Figure 4:
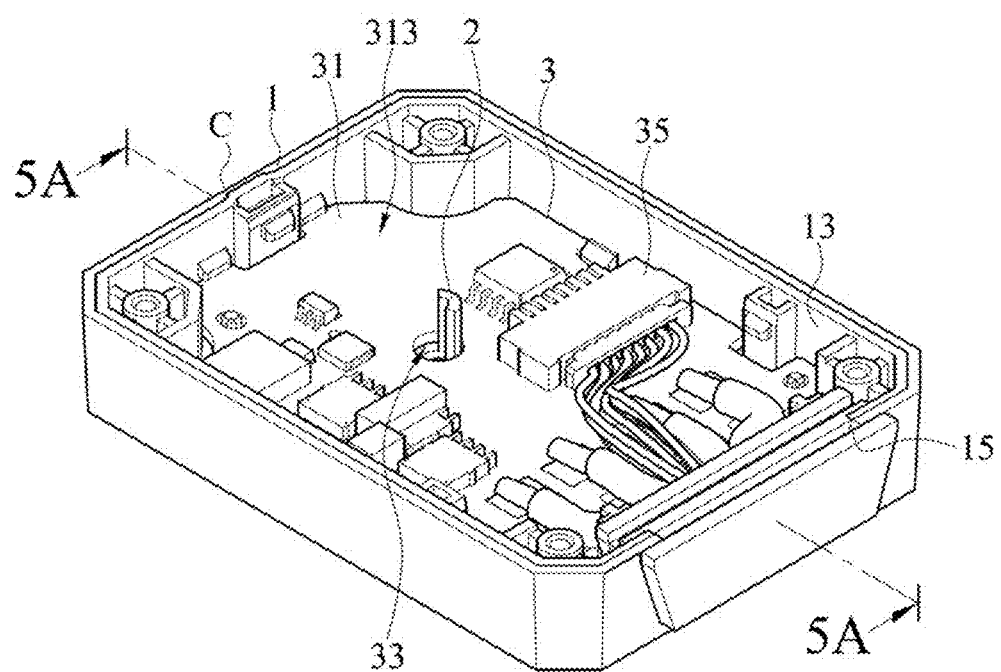
FIG. 4 illustrates a schematic view of a circuit board placed on a colloid in a housing according to the first embodiment.

Referring to FIG. 3 and FIG. 4, FIG. 3 is a schematic view of a housing partially filled with a colloid according to the first embodiment of the disclosure, and FIG. 4 is a schematic view of a circuit board placed on a colloid in a housing according to the first embodiment of the disclosure. In this embodiment, the mounting side 15 of the base 1 is one side of the base 1 that is not surrounded by the foregoing three side walls 13. A cable (not labeled) connected to the circuit board 3 may be electrically connected to another electronic component (not shown) outside the housing C by passing through the mounting side 15.

Referring to FIG. 2A and FIG. 3, further, the mounting side 15 is provided with a retaining wall 17. The retaining wall 17 is disposed on the bottom wall 11 and extends from the bottom wall 11 in a direction away from the bottom wall 11. The distance $D_3$ from a top end of the retaining wall 17 to the upper surface 11a of the bottom wall 11 is greater than the distance $D_1$ from the low scale 21 to the upper surface 11a of the bottom wall 11. In this way, when the filled colloid 51 reaches the low scale 21, the colloid 51 is blocked by the retaining wall 17 and does not flow out from the mounting side 15.

Figure 5A:
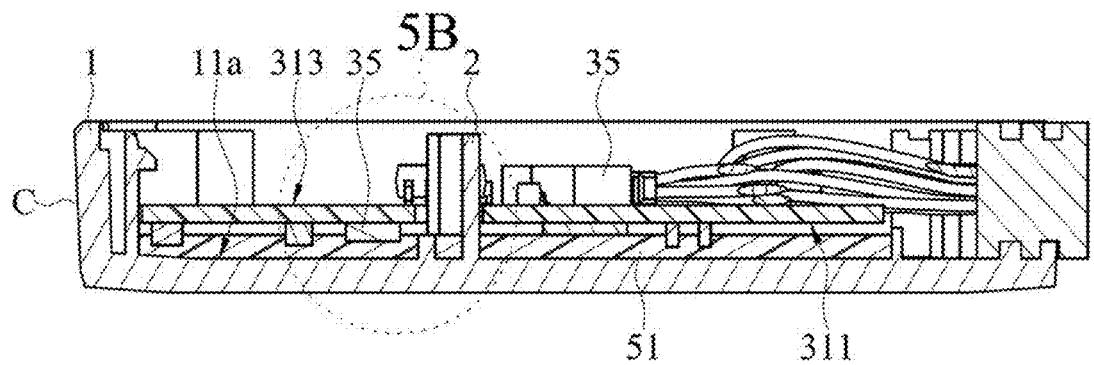
FIG. 5A illustrates a sectional view taken along a line 5A-5A in FIG. 4 according to the first embodiment.

Referring to FIG. 4 and FIG. 5A, FIG. 5A is a sectional view taken along a line 5A-5A in FIG. 4 according to the first embodiment of the disclosure. After the filled colloid 51 reaches the low scale 21, the circuit board 3 is placed on the colloid 51. Specifically, the circuit board 3 may include a board body 31 and a through hole 33. The board body 31 is provided with a first surface 311 and a second surface 313 disposed opposite to each other. After the board body 31 is mounted, the first surface 311 faces the bottom wall 11 of the base 1. The through hole 33 penetrates the first surface 311 and the second surface 313 of the board body 31. During assembling, after the mark piece 2 passes through the through hole 33, the circuit board 3 is pressed down until the board body 31 is located above the colloid 51 and the circuit board 3 can no longer be pressed down.

Figure 5B:
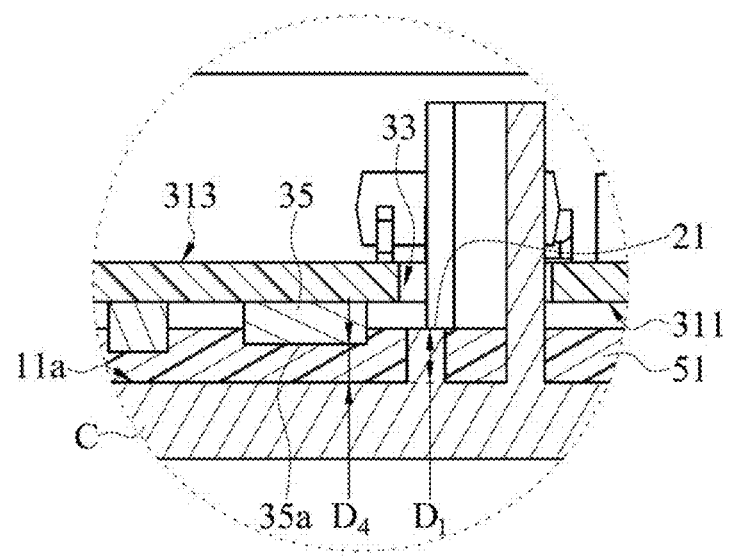
FIG. 5B illustrates a schematic partially enlarged view of 5B in FIG. 5A.

Referring to FIG. 5A and FIG. 5B, FIG. 5B is a schematic partially enlarged view of 5B in FIG. 5A. In this embodiment, the circuit board 3 may further include a plurality of electronic components 35 disposed on the first surface 311. In other words, the electronic components 35 are located on one side of the board body 31 facing the bottom wall 11. When the circuit board 3 is pressed down until some of the electronic components 35 are located in the colloid 51 and the circuit board 3 can no longer be pressed down, the distance $D_1$ from the low scale 21 to the upper surface 11a of the bottom wall 11 is greater than a longest distance $D_4$ from a top 35a of the electronic components 35 to the upper surface 11a of the bottom wall 11. That is, the distance $D_4$ from the top 35a of the electronic component 35 with the lowest height (the top 35a is closest to the first surface 311 of the board body 31) to the upper surface 11a of the bottom wall 11 is less than the distance $D_1$ from the low scale 21 to the upper surface 11a of the bottom wall 11.

Therefore, referring to FIG. 5A that due to different heights of the electronic components 35, only some of the electronic components 35 may be partially embedded in the colloid 51, and there is still a distance between the first surface 311 of the board body 31 and the colloid 51. In other words, there is still space between the colloid 51 and the first surface 311 of the board body 31 that has not been filled by the colloid 51. In this case, during a second stage of colloid filling, the colloid 52, which is shown in FIG. 6, may be supplemented through the through hole 33, to fill the space between the colloid 51 and the first surface 311. Therefore, it can be more ensured that space between the first surface 311 of the board body 31 and the bottom wall 11 and the plurality of electronic components 35 are filled with the colloids 51 and 52, and the colloids 51 and 52 can be prevented from generating bubbles and causing poor waterproof and moisture-proof effects.

Referring to FIG. 4, in some embodiments, to facilitate filling of the colloid 52 through the through hole 33, a shape of the through hole 33 is roughly equivalent to or slightly larger than an outer shape of the mark piece 2. In other words, an area of the through hole 33 is roughly equivalent to or slightly larger than a transverse cross-sectional area of the mark piece 2.

Referring to FIG. 4, in this embodiment, the through hole 33 is slightly located in a center of the board body 31. In this way, the colloid 52 injected through the through hole 33 can flow outward from the center, avoiding a case that the colloid 52 cannot flow to corners due to viscosity.

However, a position of the through hole 33 is not limited in the disclosure, and the through hole 33 may be disposed at different positions of the board body 31 according to actual requirements. For example, the through hole 33 may be located at a position of the board body 31 at which more electronic components 35 are disposed, to enable the filled colloid 52 from the through hole 33 to fill space between the electronic components 35 on the first surface 311, thereby avoiding a case that the colloid 52 cannot fill the space due to viscosity. In addition, the disclosure is not limited to only one through hole 33 being disposed, and two, three, four, or another quantity of the through holes 33 may be disposed at appropriate positions according to actual requirements.

Referring to FIG. 4 and FIG. 5A, it should be noted that in addition to being disposed on the first surface 311, the plurality of electronic components 35 may alternatively be disposed on the second surface 313. In other words, the plurality of electronic components 35 may be disposed on both surfaces of the circuit board 3 to fully utilize space in the housing C.

Referring to FIG. 5A and FIG. 6, FIG. 6 is a schematic view of an electronic device omitting a cover according to the first embodiment of the application. After the circuit board 3 correspondingly penetrates the mark piece 2 and the colloid 52 is supplemented from the through hole 33, the colloid 52 continues to be filled until the colloid 52 reaches the high scale 23 (as shown in FIG. 6). In this case, the electronic components 35 located on the first surface 311 and the second surface 313 of the circuit board 3 are all encased by the colloids 51 and 52, to provide good waterproof and moisture-proof performance.

Second Embodiment

Figure 7:
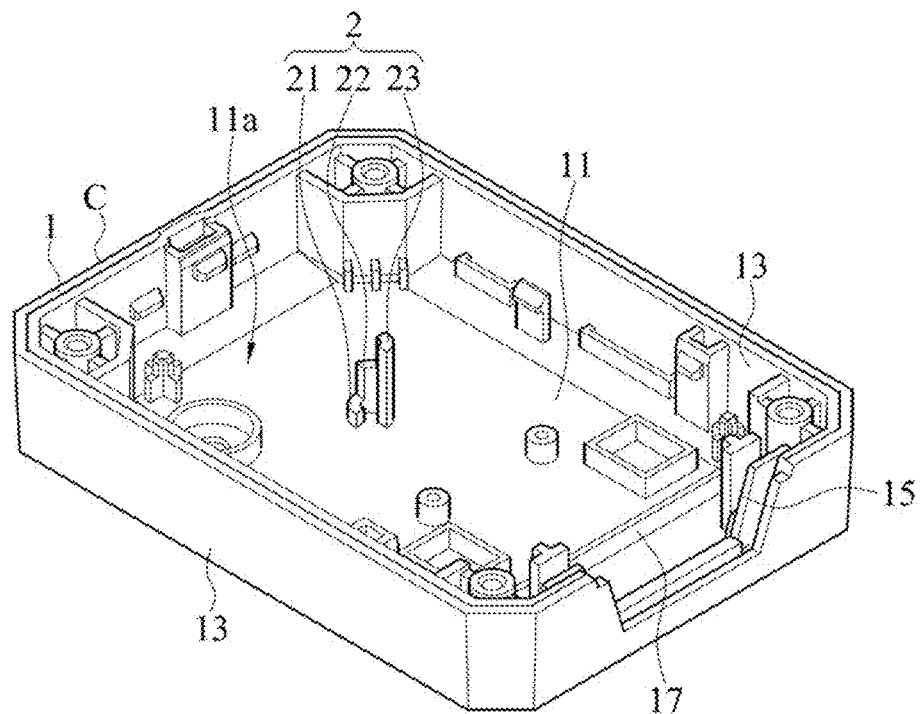
FIG. 7 illustrates a schematic perspective view of a housing according to a second embodiment.

Referring to FIG. 7, FIG. 7 is a schematic perspective view of a housing according to a second embodiment of the disclosure. In the first embodiment, the mark piece 2 includes the low scale 21 and the high scale 23 for description. However, in this embodiment, in addition to the low scale 21 and the high scale 23, the mark piece 2 further includes a middle scale 22. The middle scale 22 is located between the high scale 23 and the low scale 21 of the mark piece 2.

It should be noted that the similarities to the first embodiment in this embodiment will be marked with the same component symbols, and the same components and structures will not be repeated. In addition, the mark piece 2 may be in a cylindrical/flat shape and processed into a stepped shape, which is the same as that described in the first embodiment, and is not repeated again.

Referring to FIG. 7, in this embodiment, the colloids 51 and 52 may be filled in three stages. Specifically, the colloids 51 and 52 are filled to the low scale 21 first, and then a first circuit board 3 (as shown in FIG. 4) is placed. Next, the colloids 51 and 52 continue to be filled to the middle scale 22, and then a second circuit board 3 is placed. Finally, the colloids 51 and 52 continue to be filled until the colloids 51 and 52 fill the base 1. In addition, in the process of filling the colloids 51 and 52 in the housing C disclosed in this embodiment, the colloids 51 and 52 may also be supplemented through the through hole 33 as described above. Therefore, in this embodiment, two circuit boards 3 (referring to FIG. 5A for a placement manner of the circuit boards 3) may be accommodated in the base 1. In other words, compared with the first embodiment, the housing C of this embodiment may accommodate more electronic components 35 in the base 1.

Finally, in the application, the mark piece 2 is not limited to including only the low scale 21 and the high scale 23 as disclosed in the first embodiment, or including only the low scale 21, the middle scale 22, and the high scale 23 as disclosed in the second embodiment. In the application, the mark piece 2 may be designed to include four, five or more scales according to actual requirements, and a plurality of circuit boards 3 may layered correspondingly according to the method described above, to fill the colloids 51 and 52 in a multi-stage manner. Details are not described again.

Based on the above, the design of the mark piece 2 of the disclosure can implement multi-stage filling of the colloids 51 and 52. The colloids 51 and 52 are supplemented through the through hole 33, so that the electronic components 35 in the base 1 can be completely encased by the colloids 51 and 52, and a case of generating bubbles during filling of the colloids 51 and 52 can be alleviated, thereby providing good waterproof and moisture-proof performance.

Although the invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A housing, comprising:
   a base, comprising a bottom wall and at least one side wall, wherein the at least one side wall is vertically connected to the bottom wall, and a height of the side wall exists between a top end of the at least one side wall and the bottom wall; and
   a mark piece, disposed on the bottom wall and extending from the bottom wall in a direction away from the bottom wall, wherein the mark piece has a low scale and a high scale, a distance from the low scale to the bottom wall is less than the height of the side wall, and a distance from the high scale to the bottom wall is substantially the same as the height of the side wall;
   wherein the base further comprises a mounting side, the mounting side is provided with a retaining wall that is disposed on the bottom wall and that extends from the bottom wall in a direction away from the bottom wall, and a distance from the retaining wall to the bottom wall is greater than the distance from the low scale to the bottom wall.

2. The housing according to claim 1, wherein the mark piece is provided with a step structure, the step structure comprises a first step and a step structure, a top surface of the first step is the low scale, and a top surface of the second step is the high scale.

3. The housing according to claim 2, wherein the mark piece is in a cylindrical shape.

4. The housing according to claim 2, wherein the mark piece is in a flat shape.

5. The housing according to claim 1, wherein the mark piece further comprises a middle scale located between the high scale and the low scale of the mark piece.

6. An electronic device, comprising:
   the housing according to claim 1; and
   a circuit board, accommodated in the base, wherein the circuit board comprises:
   a board body, provided with a first surface and a second surface disposed opposite to each other, wherein the first surface faces the bottom wall;
   a through hole, penetrating the first surface and the second surface of the board body; and
   a plurality of electronic components, disposed on the first surface, wherein the distance from the low scale to the bottom wall is greater than a longest distance from tops of the electronic components to the bottom wall.

7. The electronic device according to claim 6, wherein the through hole is located in a center of the board body.

8. The electronic device according to claim 6, wherein a shape of the through hole is roughly equivalent to or slightly larger than an outer shape of the mark piece.

9. The electronic device according to claim 6, wherein the base further comprises a mounting side, the mounting side is provided with a retaining wall that is disposed on the bottom wall and that extends from the bottom wall in a direction away from the bottom wall, and a distance from the retaining wall to the bottom wall is greater than the distance from the low scale to the bottom wall.

10. The electronic device according to claim 6, wherein the mark piece is provided with a step structure, the step structure comprises a first step and a step structure, a top surface of the first step is the low scale, and a top surface of the second step is the high scale.

11. The electronic device according to claim 10, wherein the mark piece is in a cylindrical shape.

12. The electronic device according to claim 10, wherein the mark piece is in a flat shape.

13. The electronic device according to claim 6, wherein the mark piece further comprises a middle scale located between the high scale and the low scale of the mark piece.

* * * * *